United States Patent
Kim

(10) Patent No.: US 6,395,248 B1
(45) Date of Patent: May 28, 2002

(54) PROCESS FOR PREPARING POLYSILICON USING EXOTHERMIC REACTION

(75) Inventor: Hee-Young Kim, Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 0 days.

(21) Appl. No.: 09/380,902

(22) PCT Filed: Feb. 13, 1998

(86) PCT No.: PCT/KR98/00027

§ 371 (c)(1),
(2), (4) Date: Sep. 10, 1999

(87) PCT Pub. No.: WO98/40543

PCT Pub. Date: Sep. 17, 1998

(30) Foreign Application Priority Data

Mar. 13, 1997 (KR) .............................. 97-8495

(51) Int. Cl.[7] ............................. C01B 33/027
(52) U.S. Cl. .................. 423/349; 423/350; 422/146; 427/213; 427/215
(58) Field of Search ................. 423/348, 349, 423/350; 422/146; 427/213, 215

(56) References Cited

U.S. PATENT DOCUMENTS

| | | | |
|---|---|---|---|
| 4,401,687 A | 8/1983 | Rosler et al. ............. | 427/38 |
| 4,416,913 A | 11/1983 | Ingle et al. ............... | 427/45.1 |
| 4,444,812 A | * 4/1984 | Gutsche .................... | 427/255 |
| 4,963,506 A | 10/1990 | Liaw et al. ................ | 437/101 |
| 4,992,245 A | 2/1991 | Van Slooten et al. ....... | 422/146 |
| 5,168,089 A | * 12/1992 | Feygenson et al. ......... | 437/89 |
| 5,358,603 A | 10/1994 | Ibrahim et al. ............. | 156/657 |
| 5,374,413 A | 12/1994 | Kim et al. ................. | 423/349 |
| 5,483,918 A | * 1/1996 | Kobayashi ................ | 117/84 |
| 6,074,478 A | * 6/2000 | Oguro ...................... | 117/95 |

FOREIGN PATENT DOCUMENTS

JP 2-30611 1/1990

OTHER PUBLICATIONS

Erk, "Chrlorosiliane Thermodynamic Equilibria Calculations with Applications to High Purity Silicon Preparation" published in *Silicon Material Preparation and Economical Wafering Methods*, (edited by Ralph Lutwack and Andrew Morrison.), New Jersey, Park Ridge, 1984, pp. 30–57.

SRI International., "Abstract Process Economics Program Report N. 160 Silicones" published in *Process Economics Program*, Menio Park, California, 1982, pp. 65–70.

Hunt, et al. "A Through Thermodynamic Evaluation of the Silicon–Hydrogen–Chlorine System", 1972 pp. 1741–1745.

* cited by examiner

*Primary Examiner*—Steven P. Griffin
*Assistant Examiner*—Maribel Medina
(74) *Attorney, Agent, or Firm*—Ladas & Parry

(57) ABSTRACT

The disclosure describes a process for the production of polycrystalline silicon by a thermal decomposition or hydrogen reduction of a reaction gas consisting of silane gas, which comprises additionally introducing hydrogen chloride into the reaction gas and utilizing the reaction heat generated from the reaction between hydrogen chloride and silicon on the inside of the reactor as an additional heat source.

16 Claims, 2 Drawing Sheets

PROCESS FOR PREPARING POLYSILICON USING EXOTHERMIC REACTION

TECHNICAL FIELD

The present invention relates to a process for preparing polysilicon to be used as a raw material for large-diameter single crystals to be processed to silicon wafers or for solar-cell application. More specifically, it relates to a process for preparing polysilicon in large scale, which comprises depositing silicon onto the surface of seed silicon through thermal decomposition or hydrogen reduction of reactant gas containing silicon element, wherein an exothermic reaction can be additionally introduced so that the heat of reaction generated by the exothermic reaction is utilized in the deposition reaction of silicon.

BACKGROUND ART

In general, the high-purity polysilicon (or polycrystalline silicon) used as a raw material for solar cells as well as for large-diameter single crystals to be processed to silicon wafers. The polysilicon is prepared in large scale by continuously depositing silicon onto the surface of seed silicon, through thermal decomposition or hydrogen reduction of raw material gas containing silicon element. In the large-scale production of polysilicon the deposition rate of silicon is normally greater than about 0.01 $\mu$m/min.

For commercial manufacture of polysilicon, the Siemens process is widely used. This processes is carried out by depositing silicon onto the surface of electrically heated high-temperature silicon core rods from silicon element-containing gas such as trichlorosilane ($SiHCl_3$: referred as "TCS" hereinafter), dichlorosilane ($SiH_2Cl_2$) or monosilane ($SiH_4$) in a bell-jar type reactor. It is conceivable to heat a silicon core rod with a high-temperature radiation as well as with an electromagnetic wave including high-frequency wave on behalf of the electrical resistance heating via electrode. Therefore, polysilicon can be prepared regardless of the shape of the reactor if the silicon core rod is heated.

As halogen-containing silane gases for preparing polysilicon, TCS has widely been used commercially. By suing TCS as a raw material, polysilicon is prepared in the Siemens reactor through following procedure. First, a lot of thin core rods (or slim rods) made of silicon are normally installed in the reactor, with respective top-side ends of two core rods being connected with each other by placing an additional core rod as illustrated in FIG. 1 and their bottom ends being connected to two electrodes, respectively. Here, the core rods are required to be preheated to about 400 to 700° C. by a separate heating means in advance to electrical heating via electrode. Thereby the specific resistance of silicon core rods becomes so low that a large amount of electric current can be supplied through them, which renders electric heating via electrode possible. Maintaining their temperature sufficiently high, namely, about 1,000° C. or more, the silane gas is then introduced into the reactor as a reactant gas and the silicon deposition initiates. Although the high-temperature silicon deposition can be obtained only by thermal decomposition of silane gas, in many cases the reaction gas may in the deposition procedure in view of the reaction mechanism and the physical property of the product. Many elementary reactions can occur in a high temperature reactor, but are generally represented by the deposition reaction, which deposits the silicon element of silane gas on the surface of core rods and enlarges the silicon rods as time passes.

When the diameter of a silicon rod is increased, the temperature at its core section should be higher than that at its outer surface in order to maintain the surface temperature necessary for the deposition reaction; accordingly, the electric current via electrode should be increased with time. The thermal energy due to electricity should provide at least the heat required for: i) heating of the reaction gas provided into the reactor; ii) making up the heat loss emitted outward the reactor; and iii) the heat of reaction for the deposition reaction on the surface of silicon rod. In the meanwhile, it is very difficult to preheat the reaction gas sufficiently, i.e., to the required reaction-temperature level, before feeding into a reactor. Most silane gases thermally decompose by themselves at an incipient decomposition temperature, namely, at around 400° C. This causes undesirable silicon deposition on surrounding high-temperature surface, leading to a blocking inside a preheater or connection tubes. Moreover, the reaction gas is vulnerable to contamination during the preheating step. The insufficiently preheated reaction gas should then be heated further inside the bell-jar type reactor. This removes much from the surface of silicon rods. Accordingly, there is a temperature gradient in radial direction of each rod; the temperature is lowest at its surface for silicon deposition, while the temperature is highest at its core axis. Although the total surface area of the silicon rods in contact with the reaction gas increases with time, the conversion of silane gas into silicon is low because the larger the rod becomes, maintaining its surface temperature becomes more difficult. Therefore, the deposition yield of silicon is normally much lower than a thermodynamic equilibrium value of about 20 to 25 mol %. Although the total surface area of the silicon rods changes with time, the overall deposition rate of silicon is normally greater than about 0.1 to 1.0 $\mu$m/min in case of commercial-scale bell-jar type reactor.

If a silicon rod becomes larger than a certain size, its surface temperature cannot be maintained by its electrical heating alone, because its core axis cannot be heated above the melting point of silicon, 1,410° C. Although the surface area for silicon deposition increases with rod diameter, and at the same time the overall deposition rate in the reactor can be increased further by increasing the feed rate of the reaction gas, the deposition reaction should be terminated by the limitation on the heating of the enlarged silicon rod. When the diameter of the silicon rod reaches a maximum of about 10 to 15 cm, the reaction should be terminated, the reactor is dismantled, and the rod-type polysilicon products are separated from the electrodes. Thus, continuous preparation of polysilicon is impossible by using a bell-jar type reactor. Therefore, for reducing the specific electric power consumption and preparation cost, it is essential to maintain the surface temperature of the silicon rod in the limited reactor space as high as possible and to enhance thereby the silicon deposition as much as possible although the yield may be less than that achievable at a thermodynamic equilibrium.

Recently, a process for preparing polysilicon in the form of granule by using a fluidized-bed type reactor has been developed. Chemical reactions occurring in this process are basically the same as those in the bell-jar reactor. But the fluidized bed process is characterized by the fact that silicon particles are fluidized by the reaction gas provided from the lower-side of the reactor, and silicon is deposited on the surface of heated particles; thus the average size of heated particles increases with the deposition reaction. If small-size seed crystals (or seed particles) become larger in the course of the continuous deposition procedure, the degree of fluidization is reduced; thereby the larger silicon particles tend to gradually precipitate to the bottom-side of the reactor. In such a fluidized bed reactor, granule-type polysilicon can be continuously prepared, by providing seed crystals continuously or periodically into the reactor, and then by withdrawing the enlarged particles from the bottom of the reactor. Some of the particles obtained (i.e., product granules) split into smaller particles by a milling procedure, and the seed crystals thus prepared are introduced again into the reactor. As mentioned for the bell-jar type reactor, the silane gas or hydrogen gas contained in the reaction gas cannot be sufficiently preheated before being introduced into the fluidized bed reactor. In addition, the portions of the silane-gas supply means or nozzle, exposed to fluidizing high-temperature silicon particles, are also maintained at a high temperature by direct contact with the particles, heat transfer by radiation, indirect heating or the like. To prevent the silicon deposition at those portions preheating of the silane gas should be limited. Therefore, it is inevitable to heat further inside the fluidized bed reactor the reaction gas introduced or an inert gas that odes not contain a silicon element but is added as required. The thermal energy to be supplied into the fluidized bed reactor should be enough for: i) further heating of the reaction gas; ii) making up the heat loss emitted outward the reactor; and iii) the heat of reaction for the deposition reaction on silicon particles. If such energy required is not supplied duly, the surface temperature of silicon particles falls down, whereby the deposition rate of silicon or reaction efficiency will decrease. It is thus normally observed that the overall deposition rate of the fluidized-bed type reactor is normally greater than about 0.01 $\mu$m/min but much lower than 1.0 $\mu$m/min. Any prior heating methods cannot heat separately and exclusively the silicon particles residing in the reaction zone, wherein the deposition reaction occurs in the fluidized bed. In addition, the temperature at the inner walls of the reactor which are in contact continuously with fluidizing silicon particles of high temperature is the same as that of silicon particles or is higher than that. For this reason, the silicon deposition occurs even on the high-temperature reactor inner walls as well as on the surface of silicon particles. high-temperature reactor inner walls as well as on the surface of silicon particles. Specifically, when the most widely used resistance heating at the reactor walls is used for the fluidized-bed deposition reactor, the temperature at the reactor inner walls is inevitably higher than that of silicon particles. Then, the silicon deposition on the inner walls proceeds faster than on the surface of silicon particles, which deteriorates heating continuously the reactor through its walls due to the gradually thickened silicon layer on the inner walls; thereby continuous operation of the reactor becomes impossible. Furthermore, since the difference in thermal expansion between reactor material and deposited silicon layer can lead to the cracking of the reactor, the risk of accident becomes high. At present, there is no method available which can provide directly sufficient energy onto the surface of the silicon particles wherein the substantial deposition reaction of silicon is carried out, without causing the problems of contaminating silicon particles or the silicon deposition at the reactor inner walls.

In order to overcome those problems, several methods for heating the fluidized-bed deposition reactor have been suggested, but are yet unable to provide sufficient energy directly onto the surface of the silicon particles in the reaction zone. Methods suggested recently include the circulating fluidized bed method (See: U.S. Pat. Nos. 4,416,913 and 4,992,245 and Japanese Patent Laid-Open No. 2-30611 (1990)) or the microwave heating method (See: U.S. Pat. No. 5,374,413). Both the reaction zone wherein the deposition reaction from reaction gas is carried out and ii) heat is indirectly provided to the reaction zone due to the circulation or mixing of the heated particles after the heating zone is exclusively heated. Since the thermal load of the heating zone increases with the preparation rate of the reactor, there is also a limitation on such indirect energy supply into the reaction zone through the heating zone.

When introduced into the reaction zone without sufficient preheating and mixed with high-temperature silicon particles, the silane gas with high molar heat capacity quench the silicon particles and then deteriorate the deposition rate of silicon. It is thus difficult to obtain a high reaction yield. To maintain the reaction-zone temperature as high as a desired range in a given reactor, the cooled particles in the reaction zone should be mixed as fast as possible with the particles heated in the heating zone whose temperature is higher than that of the reaction zone. However, there is a limit on the heat transfer between the two zones, and increasing the flow rate of the fluidizing gas for intensive particle mixing would result in the deterioration of the reaction or energy efficiency as well as of operational safety. Thus, according to such heating methods, the fluidized bed reactor should be operated with a limited feed rate of the reaction gas or at a lower silicon surface temperature than expected.

Furthermore, the reaction gas introduced into the fluidized bed cannot be distributed uniformly between particles over the inside of the whole reaction zone and most of the gas necessarily forms bubbles. When these reaction gas bubbles rise, they expand due to sudden temperature increase and gradual decrease in pressure with height. At the same time, they coalesce with each other and then their volumetric fraction in the reaction zone becomes considerable. The possibility of silicon deposition is highest on the surface of the particles instantaneously surrounding those bubbles. But the temperature of these particles tends to fall due to the cooling by the reaction gas and energy consumption by the deposition reaction, which is an endothermic reaction. For this reason, the decrease of deposition rate is inevitable in some portion of the reaction zone. More specifically, temperatures of both gas and particle surface depend on time and location across the reaction zone. As a whole, it is preferred that the surface temperature of particles is higher at the upper side of the reaction zone, but in fact, their average temperature decreases with the distance from the heating zone. Moreover, it is not possible to heat silicon particles in the heating zone to more than a certain temperature level because of the material used for the reactor walls, the limitation of the heating apparatus and possible contamination related with heating. Thus, the deposition yield of silicon is much lower than an ideal value due to: lacks in uniform contact between the reaction gas and high-temperature particles; practical limit in the transport of thermal energy into the reaction zone; and surface-cooling at the silicon particles in contact with the reaction gas. In addition, silicon deposition on the reactor walls instead on the surface of silicon particles can be serious by the diffusion of the unreacted silane gas. Other undesirable phenomena can also be observed by the side reactions liable to be conducted at low temperature.

As is seen from the foregoing, the drawbacks to the prior processes for preparing polysilicon are that, regardless of the type of reactor, it is not possible to provide the reaction gas into the reactor after sufficient preheating; at the same time, it is difficult to maintain the surface temperature of silicon as required for the endothermic deposition reaction. According to the rule of thumb that the reaction rate increases considerably by the temperature rise of 10° C., it is quite evident that the presence of any method capable of raising the surface temperature will greatly enhance the rate and efficiency of the silicon deposition.

DISCLOSURE OF THE INVENTION

The present inventors have made extensive studies to overcome the above-mentioned problems caused in the preparation of polysilicon. They noted the fact that the reaction between hydrogen chloride (HCl: referred as "HCl" hereinafter) and silicon or HCl and some of chlorosilanes generates the chlorosilanes which can be used as a raw material for the deposition reaction of silicon, and at the same time the reaction itself is a strong exothermic reaction. As a result, they have now found that a chemical heating method can be attained by introducing HCl gas into the deposition reactor to lead to additional reactions, and then utilizing the heat of reaction generated from the additional reactions at the inside of the reactor.

It is therefore an object of the invention to provide a simple and improved method for efficiently preparing polysilicon by overcoming the limits of the prior heating methods. In more detail, the object of the invention is to provide a method for providing heat directly into the reactor by generating heat inside the reactor at the very surface of silicon residing in the reaction area or vicinity of the reaction area wherein the deposition occurs.

It is a further object of the present invention to provide a method for preparing polysilicon, which can heat the deposition reaction area while not affecting the purity of silicon to be prepared.

It is another object of the present invention to provide a method for increasing the total efficiency of the preparation of polysilicon by using the fundamental configuration of any type of the reactor which is already installed and in use as well as of a novel reactor.

The present invention proposes a chemical heating method which comprises introducing HCl in addition to the reaction gas into a reactor for preparing polysilicon. As a heat source for the silicon deposition, the present invention utilizes the strong heat generated from a gasification reaction between HCl and silicon, and from a chemical reaction between HCl and silane gases which can proceed at the surface of silicon or in the space within the reactor. According to the present invention, the heat of reaction generated by the overall chemical reactions which may occur due to the addition of HCl can be used as the heat required for: i) maintaining the surface temperature of silicon at which the silicon deposition occurs; ii) supplying the heat of the deposition reaction; and iii) providing additional energy to heat the reaction gas.

When considering only exothermic reactions (Si+HCl (r) $SiHCl_3+SiHCl_4$ or $SiHCl_3+HCl$ (r) $SiCl_4+H_2$) which occur by the addition of HCl into the reactor, it is noted that solid-state silicon converts to chlorosilane gases such as TCS or tetrachlorosilane ($SiCl_4$). This can lead to an misunderstanding that, due to the consumption of silicon and to the increase of tetrachlorosilane concentration in the gas phase, the present invention is against the object of reactor to deposit silicon. However, the important spirit of the present invention resides in the facts that, by utilizing the heat of reaction generated from the exothermic reactions as chemical heating means at the inside of the reactor in which the direct heating is difficult by the external heating means installed for the reactor, one can easily obtain more amount of silicon deposition than that consumed by the exothermic reactions.

It should also be noted that the additional exothermic reactions due to HCl generate chlorosilanes, which can be reused directly or eventually as a raw material for the silicon deposition. Since those advantages of the chemical heating method are not largely affected by reaction pressure, the method does not require any particular restriction on operating conditions.

When HCl contacts with the surface of a solid-state silicon material, a gasification reaction proceeds to form TCS or tetrachlorosilane. According to a reference publication (Process Economics Program Report No. 160 "Silicones", pp. 65–70, SRI International, June, 1983), this gasification reaction is characteristic of generating the high heat of reaction as much as 52 kcal/TCS-mole. In case of high-purity silicon, since there is no contaminant capable of functioning as catalyst, the gasification reaction begins apparently at 500° C. or more and the reaction rate increases with temperature. As proposed by Ibrahim, et al in U.S. Pat. No. 5,358,603(1994), such a property is applicable to remove high-purity silicon undesirably deposited and accumulated on the part of the solid surface exposed at the inside of reactor after stopping the operation of a fluidized bed reactor for preparing polysilicon. In addition, the reaction between TCS and HCl ($SiHCl_3+HCl$ (r) $SiCl_4+H_2$) is also exothermic according to the thermodynamic properties suggested in L. P. Hunt and E. Sirtl, J. Electrochem. Soc., 119, pp. 1741 (1972).

The characteristic of the heating method proposed in the present invention is not specific to those of the reaction between HCl and silicon or TCS. When the chlorosilane gases such as TCS or tetrachlorosilane are generated by the exemplified exothermic reactions, they participate in silicon deposition or various side reactions inside the high-temperature reactor. Furthermore, the deposition reaction, as a Si—H—Cl system, inherently includes various chlorosilanes and HCl as reaction intermediates or byproducts. In terms of reaction mechanism, the exemplified reactions are included in the elementary reactions constituting the whole reaction steps for silicon deposition.

If HCl is additionally introduced into any kind of silicon deposition reactor, regardless of the bell-jar or fluidized-bed type, HCl is then mixed easily with the main components of the reaction gas, namely, silane gas and hydrogen. Thus, on the surface of silicon wherein the substantial deposition reaction occurs, the reaction route becomes very complicated; various elementary reactions related with silicon deposition proceed at the same time among the reaction gas components and the chlorosilanes generated by the gasification reaction as well as by the deposition reaction steps. Therefore, it is very hard to explain quantitatively the detailed reaction mechanism and the heat of reaction independently from the individual elementary reaction.

In addition, in case of such a Si—H—Cl reaction system, various complicated reactions can proceed at the same time not only on the surface of silicon but in a gas state. Then, the whole elementary reactions within the reactor which can be included in the reactions caused by the additional HCl or in the deposition reaction cannot be analyzed discretely; thereby, it is difficult to discriminate thermodynamic interrelations among the elementary reactions. However, as a whole, the additional introduction of HCl makes it possible to reduce the heat of reaction for unit amount of silicon deposition or even to change the overall deposition reaction from an endothermic reaction to an exothermic one.

The present inventors have confirmed the effect of exothermic reaction through experiments, introducing HCl into the reactor in addition to the reaction gas for the silicon deposition. In case that TCS, which is widely utilized for commercial preparation and causes the most severe heat-supply problem due to high reaction temperature, is used as a raw material, the characteristic of the present invention can be explained as follows in terms of the exothermic effect attributed only to the gasification of silicon.

In the Si—H—Cl system where TCS and hydrogen are introduced as the reaction gas, there can exist silicon as a solid-state material as well as gas-state components including hydrogen, HCl, and various chlorosilanes such as TCS, tetrachlorosilane, dichlorosilane ($SiH_2Cl_2$) and silicon dichloride ($SiCl_2$). It is well known that when the Si—H—Cl system approaches an ideal chemical equilibrium state, the deposited silicon amounts to about 20 to 25% by mole of the introduced TCS depending on the reaction temperature, pressure and composition of the reaction gas (See: "Silicon Material Preparation and Economical Wafering Methods", Eds., R. Lutwack and A. Morrison, pp. 30–57, Noyes Publications, Park Ridge, N.J., USA, 1984; ISBN 0-8155-0990-1).

It is also known that the silicon deposition is an endothermic reaction and the heat of reaction increases with temperature. When the reaction-gas composition is $SiHCl_3/H_2=40/60$ (on mole basis), the estimated heat of reaction for depositing 1 mole of silicon at 700° C., 800° C., 900° C. and 1,000° C. under the pressure of 2 bar is 2.7, 5.3, 10.4, 20.2 kcal/mole, respectively, according to the thermodynamic properties suggested in L. P. Hunt and E. Sirtl, J. Electrochem. Soc., 119, 1741 (1972). The values change little with reaction pressure. The gasification reaction of silicon, deposition reaction and various side reactions proceed simultaneously at the moment when HCl mixed with reaction gas within the reactor starts reaction on the surface of silicon. Unless the feed rate of HCl is as high as that of TCS, the foregoing reactions are represented by the deposition reaction of silicon as a whole. Nevertheless, as the reaction temperature or the heat of reaction required for the deposition decreases, the exothermic effect due to the gasification reaction becomes more remarkable.

It is now necessary to separate only the gasification reaction among such complicated reactions for more quantitative thermodynamic interpretation as follows. Under the same temperature and pressure condition as in the foregoing example and a molar ratio of $HCl/H_2=10/90$, the heat of reaction generated from the gasification reaction between 1 mole of silicon and HCl is 55.7, 55.0, 52.9 and 46.9 kcal/mole, respectively. As seen from the foregoing, the amount of heat generated from the gasification reaction for 1 mole of silicon is much higher than the heat of reaction required for the deposition of 1 mole of silicon, and the difference becomes larger as the reaction temperature is lower; it becomes more than about 10 times at 800° C. or less. For example, the 55 kcal of heat generated at the surface of silicon from the independently complete gasification reaction of 1 mole of silicon at 800° C. under 2 bar corresponds to the amount for providing the heat of reaction required for the deposition of about 10 mole of silicon.

In addition, this amount of heat corresponds to a large amount of heat capable of additionally heating each of 10 mole of hydrogen and TCS by at least 700° C. and 200° C. or so, respectively. Furthermore, this amount of heat corresponds to an amount capable of heating 10 mole of silicon by no less than 800° C. Therefore, a considerable heating effect can be attained even if the amount of HCl causing the gasification reaction is relatively less than that of silane gas causing the deposition reaction. The heat generated as such is not accumulated locally and must be utilized in maintaining reaction temperature and reaction rate at the surface of silicon, supplying the heat required for the deposition reaction, and heating further the reaction gas of relatively low temperature. Meanwhile, when considering the practical limits imposed on experiment, it is almost impossible due to the complicated reaction mechanism within the deposition reactor to explain separately and quantitatively the effects of additionally introduced HCl on every elementary reactions related to silicon deposition in the overall Si—H—Cl reaction system. However, the foregoing estimation results reveal that, at least at a chemical equilibrium, the more addition of HCl leads to the more enhanced exothermic effect of the gasification reaction, and the effect is more pronounced when temperature falls. Therefore, the increased exothermic effect results in reducing the total heat of reaction required for the whole Si—H—Cl reaction system. Then, the whole reaction system can be changed to an exothermic reaction, if the addition of HCl is even more increased.

Under an ideal equilibrium condition, the specific yield of deposited silicon from the silane gas will decrease as the degree of HCl addition to the reaction gas increases. This means that the increase of the gasification reaction accompanying the decrease in the specific yield will generate much more heat and unreacted high-purity chlorosilanes. It is practically impossible to confirm experimentally such phenomenon conceivable in an equilibrium state, but such a tendency can easily be predicted. Accordingly, even if the reaction condition is deviated from an ideal equilibrium state, it is preferred to control the concentration of HCl among gases in a reactor, i.e., not to be excessive, so as to obtain an acceptable silicon yield. Meanwhile, the deposition yield in conventional deposition reactors is significantly lower than an ideal equilibrium value. From the viewpoint of such an actual limitation, some decrease in the equilibrium yield due to the additional introduction of HCl is not an important matter.

On the contrary, to overcome the limit or problem of the prior heating method resulting in a limited deposition yield far from the ideal value due to difficulties in direct heating of the silicon surface wherein the deposition reaction occurs, it is apparently advantageous to prepare polysilicon effectively by utilizing the chemical heating effect through the addition of HCl.

In addition, although the unreacted chlorosilane gases are generated in and exhausted from a reactor with the increase of the gasification reaction, those gases can be recycled to the deposition reactor after separation or reused as raw materials for the silicon deposition via a necessary conversion process. In this regard, it is not significantly meaningful to determine an appropriate amount of HCl added to the reaction gas, with a deposition reactor itself being the only system for optimization. On the contrary, it is necessary to optimize the amount of HCl added to the reaction gas by considering the economic condition and efficiency, including the preparation and supply of raw material gases and the separation, recovery and recycling procedures of gases exhausted from reactors. In addition, a much higher deposition rate can be obtained by controlling the composition of silane gas. For example, if a lower molecular-weight component such as dichlorosilane instead of TCS single component can be included into the silane gas constituting the reaction gas, the equilibrium yield at the corresponding reaction temperature as well as the practical deposition rate can be greatly enhanced.

Another aspect of the present invention is that the HCl used in the chemical heating via exothermic reaction is one of the gas-phase components included inherently in the Si—H—Cl system and is generated as an intermediate or byproduct of the deposition reaction. Accordingly, the additional introduction of HCl does not cause undesirable new problems to the reaction system. On the other hand, purified HCl which is additionally introduced to the deposition reactor does not serve as a contaminant in the preparation of silicon, and thus do not harm the purity of the product. On the contrary, when a trace of metal impurity exists on the surface of silicon wherein the deposition occurs, there is a possibility that the HCl will cause the metal impurity to be transformed into metal chloride and removed from the surface of silicon.

The present invention will be explained with reference to the drawings.

The bell-jar type reactor used in the present invention includes any kind of cylindrical-type reactor for preparing polysilicon in the form of rod.

In the bell-jar type reactor, the reaction gas for the silicon deposition, i.e., silane gas and hydrogen, can be provided separately, but these components can also be provided into the reactor in a mixed form. In the additional introduction of HCl according to the present invention, HCl can be premixed with either component of the reaction gas, but it may also be added separately as a matter of convenience as illustrated in FIG. 1. HCl can also be introduced into the reactor diluted with an inert gas not containing both hydrogen and silicon elements so as to control the composition of the Si—H—Cl system and the partial pressure of HCl in a reactor. Moreover, the additional HCl can be introduced in various modes: by continuous, periodical or pulse type, depending on the internal structure of the reactor or operational characteristic, or by adjusting its feed rate with time. Accordingly, even in case of using the existing installed reactor, the present invention can easily be carried out by simply modifying the gas distribution means. To enhance heat efficiency within the reactor, if necessary, HCl may be preheated and then provided into it together with the reaction gas or separately. However, this is not a significant matter, since the amount of additional HCl is not large and the heat duty for its preheating is less than that of silane gas. The additional HCl and reaction gas components can be mixed naturally with each other inside the high-temperature reactor. It is then not probable that a local overheating of silicon happens due to unevenly concentrated flow of HCl along the partial surface of silicon. Thus, it is not necessary to additionally install a separate mixing means inside the reactor.

In case the feed rate of HCl is excessive, the consumption of silicon within the reactor may exceed the deposition amount of silicon, which is not preferable for the reactor. Accordingly, it is preferred that the amount of HCl (based on mole) to be supplied per unit time is optimized within the range of a maximum of about 100%, preferably about 60%, based on the total mole number of silane gas which is supplied into the reactor.

In case of using a fluidized bed reactor so as to prepare polysilicon in the form of granule, various structures or heating methods can be utilized for the reactor. Regardless of its structure and heating means, the present invention can be easily applied to the fluidized bed process. Silane gas and hydrogen as reaction gas components are added together or, in general, separately to the fluidized bed reactor. This separate supply is more specific when the inside of the fluidized bed is divided into a heating zone and a reaction zone. When HCl is additionally introduced according to the present invention, HCl can be premixed with either of the reaction gas components and easily provided into the reaction zone, but it may be separately provided into the reactor as illustrated in FIG. 2.

In addition, in order to control the composition of the Si—H—Cl system and the partial pressure of HCl inside the reactor, HCl can be diluted with other inert gas not containing silicon element such as hydrogen, argon and helium and then provided into the reactor. The additional HCl can be introduced in various modes: by continuous, periodical or pulse type, depending on the internal structure of the reactor and operational characteristic, or by adjusting its feed rate with time. Thus, even in case of using the existing installed reactor, the present invention can easily be carried out by simply modifying the gas distribution means. To enhance heat efficiency within the fluidized bed reactor, if necessary as in case of the bell-jar type reactor, HCl may be preheated and then provided into the reactor together with the reaction gas or separately. The HCl additionally introduced and reaction gas can be mixed naturally with each other inside the high-temperature fluidized bed where silicon particles are continuously fluidizing. It is then not probable that a local overheating of silicon happens due to unevenly concentrated flow of HCl along the surface of partial silicon particles.

In case of the fluidized bed reactor exemplified in FIG. 2 according to the present invention, an increased addition of HCl results in enhanced heat supply into the reaction zone, and then much more reaction gas can be introduced into the reactor. This leads to a corresponding increase in the deposition rate of the reactor. Then, the average size of each fluidizing particle can also be enlarged if the feed rate of reaction gas is raised, thereby increasing the average particle diameter of the product. However, in the same way as the bell-jar type reactor, it is not preferable to maintain the feed rate of HCl too high, because the deposition yield at an equilibrium state can be greatly lowered thereby. In addition, an excessively high temperature of silicon surface can cause in an increase in the high concentration of HCl and undesirable high-molecular-weight silicon chloride in exhaust gas from the reactor. Accordingly, it is preferred that the amount of HCl based on mole to be supplied per unit time is optimized within the range of maximum about 100%, preferably about 60%, based on the total mole number of silane gas which is supplied into the reactor.

BEST MODE FOR CONDUCTING THE INVENTION

The present invention will now be explained in more detail with reference to the following examples, but it is to be understood that the present invention is not restricted thereto and various modifications are possible within the scope of the invention.

Example 1 (Comparative Example)

Figure 1:
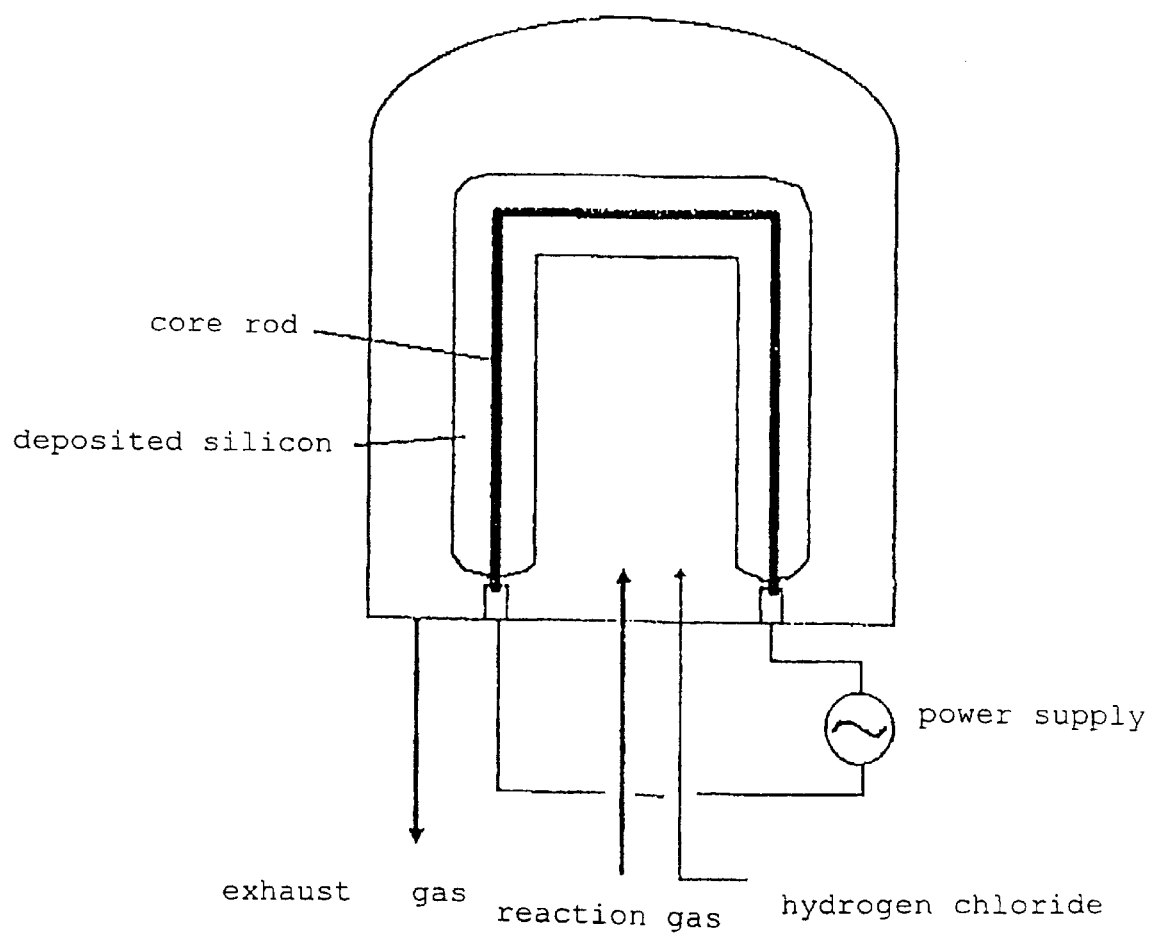
FIG. 1 shows an illustrated view of the bell-jar type of reactor used in the preparation of polysilicon in the form of rod according to the present invention.
Figure 2:
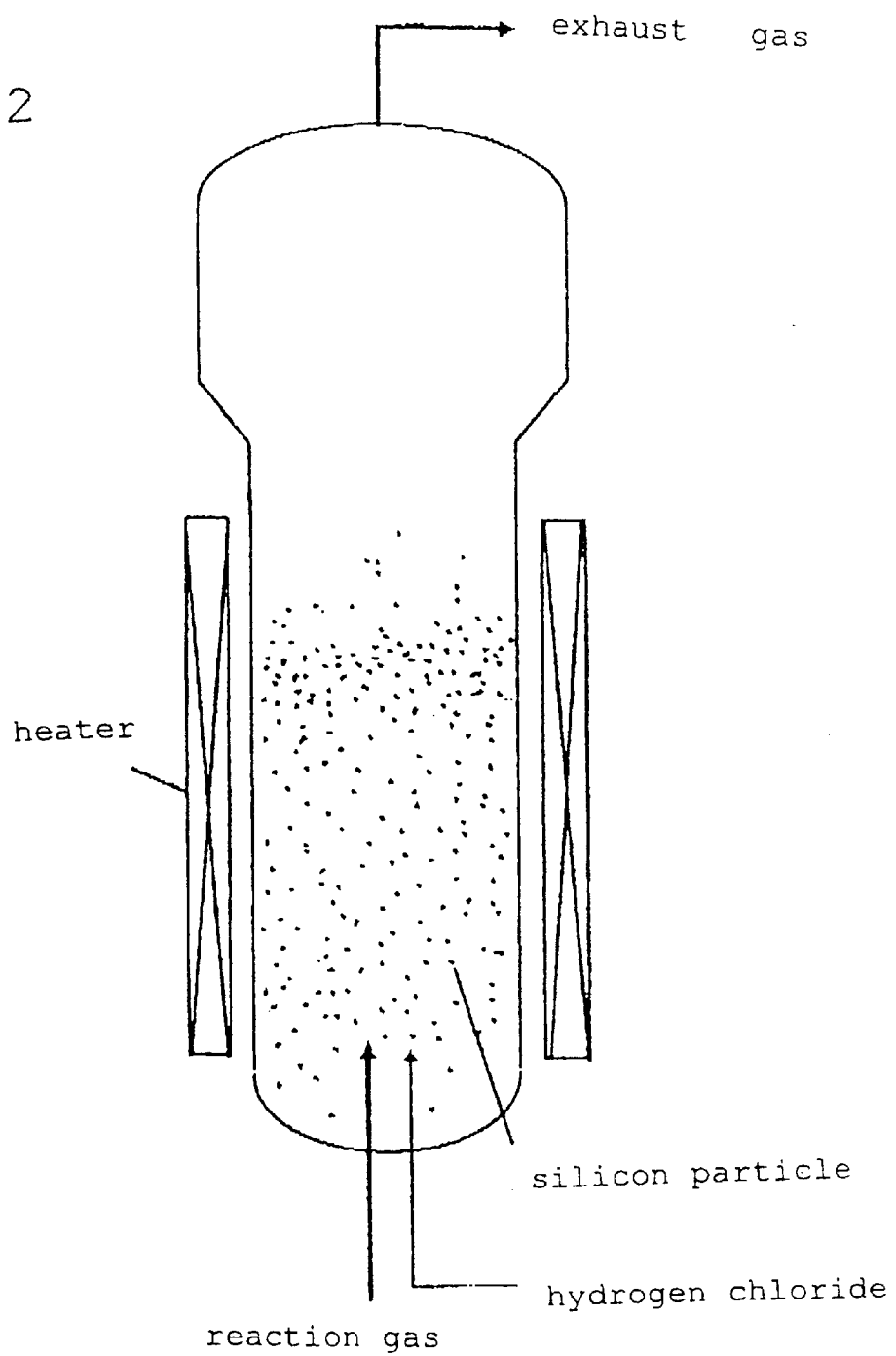
FIG. 2 shows an illustrated view of the fluidized bed reactor used in the preparation of polysilicon in the form of granule according to the present invention.

In this Example, the silicon deposition was carried out by using a straight tubular type of deposition reactor representing the characteristic of the bell-jar type reactor as in FIG. 1. A silicon rod with a diameter of 10 mm and a length of 200 mm was mounted vertically inside a quartz tube with an inner diameter of 25 mm and a thickness of 3 mm. Both ends of the silicon rod was fixed with graphite fittings connected with copper electrodes, respectively. The reactor was then assembled with the quartz tube to be sealed. A heating coil connected to a ratio frequency generator was installed on the outside of the reactor and then a high frequency power was provided to the heating coil to preheat the silicon rod up to 750° C. After the preheating step, electric current was supplied through the electrodes which were connected into the reactor to maintain the surface temperature of silicon at about 1,250° C. While maintaining the electric power supply at a constant level and the inside pressure of the reactor at about 2 bar, hydrogen and TCS (TCS) gases were preheated to about 100° C. and then supplied constantly at 7.2 mole and 4.8 mole per hour, respectively, through the bottom of the reactor as shown in Table 1. The exhaust gas resulted from the reaction was vented from the top of the reactor. It was found that during the course-of the reaction the surface temperature of the silicon rod was greatly decreased from the incipient surface temperature, 1,250° C. This was attributed to the surface cooling by the reaction gas and the heat of reaction. Under the constant electric power supply the surface temperature of the silicon rod decreased with time as summarized in Table 1. After 4 hours, the reaction was completed and the silicon rod was put out of the reactor to measure the weight thereof. As a result, the deposited amount of silicon during the 4 hours was about 25.1 g.

Example 2

The same procedure as in Example 1 (Comparative Example) was repeated while preheating HCl at a rate of 0.05 mole per hour up to 200° C. so that the HCl/TCS ratio in the reaction gas was 1% by mole, and additionally and continuously adding it. It was found that the surface temperature of the silicon rod in the course of the reaction was continuously decreased from 1,250° C. at the initiation of the deposition reaction, due to the surface cooling by the reaction gas and to the heat of reaction. Under the constant electric power supply the surface temperature of the silicon rod changed with time as summarized in Table 1. However, the decrease of temperature was less when compared to Example 1 (Comparative Example). As a result, the deposited amount of silicon during the 4 hours was about 26.1 g, showing a 4% increase as compared to the Comparative Example in which HCl was not additionally introduced. Namely, it was noted that, by additionally introducing HCl into the reaction gas, the increase in both the surface temperature of silicon and deposited amount was obtained even at the same amount of electric power for heating silicon as compared to the case of not introducing HCl.

Example 3

The same procedure as in Example 1 (Comparative Example) was repeated while preheating HCl at a rate of 0.24 mole per hour up to 200° C. so that the HCl/TCS ratio in the reaction gas was 5% by mole, and additionally and continuously adding it. It was found that the surface temperature of the silicon rod in the course of the reaction was continuously decreased from 1,250° C. at the initiation of the deposition reaction, due to the surface cooling by the reaction gas and to the heat of reaction. Under the constant electric power supply the surface temperature of the silicon rod changed with time as summarized in Table 1. However, the decrease of temperature was less when compared to Example 1 (Comparative Example). As a result, the deposited amount of silicon during the 4 hours was about 28.5 g, showing a 14% increase as compared to the Comparative Example in which HCl was not additionally introduced. Namely, it was noted that, by additionally introducing HCl into the reaction gas, the increase in both the surface temperature of silicon and deposited amount was obtained even at the same amount of electric power for heating silicon as compared to the case of not introducing HCl.

Example 4

The same procedure as in Example 1 (Comparative Example) was repeated while preheating HCl at a rate of 0.48 mole per hour up to 200° C. so that the HCl/TCS ratio in the reaction gas was 10% by mole, and additionally and continuously adding it. It was found that the surface temperature of the silicon rod in the course of the reaction was continuously decreased from 1,250° C. at the initiation of the deposition reaction, due to the surface cooling by the reaction gas and to the heat of reaction. Under the constant electric power supply the surface temperature of the silicon rod changed with time as summarized in Table 1. However, the decrease of temperature was less when compared to Example 1 (Comparative Example). As a result, the deposited amount of silicon during the 4 hours was about 30.1 g, showing a 20% increase as compared to the Comparative Example in which HCl was not additionally introduced. Namely, it was noted that, by additionally introducing HCl into the reaction gas, the. increase in both the surface temperature of silicon and the deposited amount was obtained even at the same amount of electric power for heating silicon as compared to the case of not introducing HCl.

Example 5

The same procedure as in Example 1 (Comparative Example) was repeated while preheating HCl at a rate of 0.96 mole per hour up to 200° C. so that the HCl/TCS ratio in the reaction gas was 20% by mole and additionally and continuously adding it. It was found that the surface temperature of the silicon rod in the course of the reaction was continuously decreased from 1,250° C. at the initiation of the deposition reaction, due to the surface cooling by the reaction gas and to the heat of reaction. Under the constant electric power supply the surface temperature of the silicon rod changed with time as summarized in Table 1. However, the decrease of temperature was less when compared to Example 1 (Comparative Example). As a result, the deposited amount of silicon during the 4 hours was about 30.9 g, showing a 23% increase as compared to the Comparative Example in which HCl was not additionally introduced. Namely, it was noted that, by additionally introducing HCl into the reaction gas, the increase in both the surface temperature of silicon and the deposited amount was obtained even at the same amount of electric power for heating silicon as compared to the case of not introducing HCl.

Example 6

Under the same conditions as in Example 1 (Comparative Example), hydrogen and TCS preheated to about 100° C. were constantly introduced at a rate of 9.0 mole and 6.0 mole per hour, respectively, through the bottom of the reactor as shown in Table 1. The same procedure as in Example 1 was repeated while preheating HCl at a rate of 1.2 mole per hour up to 200° C. so that the HCl/TCS ratio in the reaction gas was 20% by mole, and additionally and continuously adding it. It was found that the surface temperature of the silicon rod in the course of reaction was continuously decreased from 1,250° C. at the initiation of the deposition reaction, due to the surface cooling by the reaction gas and to the heat of reaction. Under the constant electric power supply the surface temperature of the silicon rod changed with time as summarized in Table 1. However, the decrease of temperature was less when compared to Example 1 (Comparative Example). As a result, the deposited amount of silicon during the 4 hours was about 35.8 g. Namely, it was noted that, by additionally introducing HCl into the reaction gas, the increase in both the surface temperature of silicon and deposited amount was obtained even at the same amount of electric power for heating silicon as compared to the case of not introducing HCl.

Example 7

Under the same conditions as in Example 1 (Comparative Example), hydrogen preheated to about 400° C. and TCS preheated to about 200° C. were constantly introduced at a rate of 9.0 mole and 8.0 mole per hour, respectively, through the bottom of the reactor as shown in Table 1. The same procedure as in Example 1 was repeated while preheating HCl up to 350° C. and additionally introducing 0.2 mole of HCl at every 5 minutes in pulse type to the reaction gas so that the HCl/TCS ratio based on average value was 30% by mole. It was found that the surface temperature of the silicon rod in the course of the reaction was continuously decreased from 1,250° C. at the initiation of the deposition reaction, due to the surface cooling by the reaction gas and to the heat of reaction. Under the constant electric power supply the surface temperature of the silicon rod changed with time as summarized in Table 1. However, the decrease of temperature was less when compared to Example 1 (Comparative Example) wherein the amount of reaction gas was much less. As a result, the deposited amount of silicon during the 4 hours was about 40 g. Namely, it was noted that, by additionally introducing HCl into the reaction gas, the increase in both the surface temperature of silicon and the deposited amount was obtained even at the same amount of electric power for heating silicon as compared to the case of not introducing HCl.

Example 8

Under the same conditions as in Example 1 (Comparative Example), hydrogen preheated to about 400° C. and TCS preheated to about 200° C. were constantly introduced to the reaction gas at a rate of 10.0 mole and 10.0 mole per hour, respectively, through the bottom of the reactor as shown in Table 1. The same procedure as in Example 1 was repeated while preheating HCl at a rate of 4.0 mole per hour up to 350° C. so that the HCl/TCS ratio in the reaction gas was 30% by mole, and additionally and continuously adding it. It was found that the surface temperature of the silicon rod in the course of the reaction was decreased with time from 1,250° C. at the initiation of the deposition reaction. Under the constant electric power supply the surface temperature of the silicon rod changed with time as summarized in Table 1. However, the decrease of temperature was less as the surface temperature of silicon became lower. As a result, the deposited amount of silicon during the 4 hours was about 41.9 g. Namely, it was noted that, by additionally introducing HCl into the reaction gas, the increase in both the surface temperature of the silicon and deposited amount was obtained even at the same amount of electric power for heating silicon as compared to the case of not introducing HCl.

Example 9

Under the same conditions as in Example 1 (Comparative Example), hydrogen preheated to about 400° C. and TCS preheated to about 200° C. were constantly introduced at a rate of 10.0 mole and 15.0 mole per hour, respectively, through the bottom of the reactor as shown in Table 1. The same procedure as in Example 1 was repeated while preheating HCl at a rate of 4.0 mole per hour up to 350° C. so that the HCl/TCS ratio in the reaction gas was 40% by mole, and additionally and continuously adding it. It was found that the surface temperature of the silicon rod in the course of the reaction was decreased with time from 1,250° C. at the initiation of the deposition reaction, due to the surface cooling by the reaction gas and to the heat of reaction. Under the constant electric power supply the surface temperature of the silicon rod changed with time as summarized in Table 1. However, the decrease of temperature was not remarkable after 2 hours. As a result, the deposited amount of silicon during the 4 hours was about 38.7 g. Namely, it was noted that, by additionally introducing HCl into the reaction gas, the increase in both the surface temperature of silicon and the deposited amount was obtained even at the same amount of electric power for heating silicon as compared to the case of not introducing HCl.

Example 10 (Comparative Example)

10 kW electric resistance heater was mounted at the inside of a stainless cylinder and then a quartz tube with an inner diameter of 55 mm (outer diameter 61 mm) and a length of 700 mm was vertically installed inside the heater. At the bottom of the quartz reactor was installed a porous gas distribution plate. A nozzle made of a quartz tube with a diameter of 10 mm was fixed perpendicular to the center of the gas distribution plate so that the top end had a height of 50 mm from the gas distribution plate. 500 g of silicon particles with an average diameter of about 0.55 mm were charged into the reactor and then the reactor began to be heated by the heater. Hydrogen preheated up to 400° C. was introduced at a flow rate of 13.2 mole per hour via the gas distribution plate as a fluidizing gas. Hydrogen was also introduced at a rate of 1.8 mole per hour via the nozzle. The inner pressure of the reactor was maintained constant so as to be about 1.6 bar at the exit. The temperature at the top side of the fluidized bed was maintained nearly constant at about 1,020° C. according to heating by the heater, while the silicon particles were fluidized by hydrogen. The electric power consumed by the heater was then measured to be 3.4 kW. TCS used in the reaction gas was preheated up to about 250° C. at the flow rate of 10.0 mole per hour and then was introduced via the nozzle in addition to hydrogen (1.8 mole/hr) which was supplied from the beginning of operation. When the reaction gas began to be introduced into the fluidized bed maintained at about 1,020° C., the temperature of the fluidized bed started to be decreased. Thus, the electric power of the heater was increased to 3.76 KW to maintain the temperature of the fluidized bed at least 800° C. or more. While keeping the above-mentioned conditions constant, the deposition reaction was carried out. As shown in Table 2, the temperature at the topside of the fluidized bed was maintained at the range of 835 to 873° C. After 5 hours of deposition reaction, heating was stopped and at the same time the reaction gas and hydrogen gas were replaced with nitrogen; then the reactor was cooled. The total weight of silicon particles measured after dismantling the reactor was 648 g and the weight of the deposited silicon was about 148 g.

Example 11

As summarized in Table 2, the deposition reaction of silicon was carried out with additional supply of HCl in accordance with the present invention. The other methods and conditions were the same as in Example 10 (Comparative Example). HCl and helium as an inert gas for diluting were mixed with each other with the respective flow rate of 0.2 mole per hour, and then preheated to about 300° C. The deposition reaction was then executed while the mixed gas was continuously introduced via the gas distribution plate. The electric power of the heater was increased up to 3.76 KW and fixed while introducing both TCS and HCl. As a result of the deposition reaction while keeping the above-mentioned conditions constant as shown in Table 2, the temperature at the topside of the fluidized bed was observed in the range of 846 to 895° C., comparatively higher than that of Example 10 (Comparative Example), due to an exothermic effect of HCl additionally introduced with the HCl/TCS ratio being 2% by mole. After 5 hours of the deposition reaction, the weight of the deposited silicon was about 157 g, which showed about a 5% increase as compared to that of Example 10 (Comparative Example).

Example 12

As summarized in Table 2, the deposition reaction of silicon was carried out with additional supply of HCl in accordance with the present invention. The other methods and conditions were the same as in Example 10 (Comparative Example). HCl and helium as an inert gas for diluting were mixed with each other with the respective flow rate of 1 mole per hour, and then preheated to about 300° C. The deposition reaction was executed while the mixed gas was continuously introduced via the gas distribution plate. The electric power of the heater was increased up to 3.76 KW and fixed when both TCS and HCl began to be supplied. As a result of conducting the deposition reaction while keeping the above-mentioned conditions constant as shown in Table 2, the temperature at the topside of the fluidized bed was observed in the range of 872 to 920° C., comparatively higher than that of Example 10 (Comparative Example), due to an exothermic effect of HCl additionally introduced with the HCl/TCS ratio being 10% by mole. After 5 hours of the deposition reaction, the weight of the deposited silicon was about 170 g, which showed about a 15% increase as compared to that of Example 10 (Comparative Example).

Example 13

As summarized in Table 2, the deposition reaction of silicon was carried out with additional supply of HCl in accordance with the present invention. The other methods and conditions were the same as in Example 10 (Comparative Example). HCl and helium as an inert gas for diluting were mixed with each other with the respective flow rate of 1.0 mole per hour, and then preheated to about 300° C. The deposition reaction was executed while the mixed gas was continuously introduced via the gas distribution plate. The electric power of the heater was lowered to and fixed at 3.00 KW when both TCS and HCl began to be supplied. As a result of conducting the deposition reaction while keeping the above-mentioned conditions constant as shown in Table 2, the temperature at the topside of the fluidized bed was observed in the range of 838 to 907° C., comparatively higher than that of Example 10 (Comparative Example), due to an exothermic effect of HCl additionally introduced with the HCl/TCS ratio being 10% by mole. After 5 hours of the deposition reaction, the weight of the deposited silicon was about 159 g, which showed about a 7% increase as compared to that of Example 10 (Comparative Example).

Example 14

As summarized in Table 2, the same deposition reaction of silicon as in Example 10 (Comparative Example) was repeated, except that the flow rate of TCS introduced was increased to be 14.0 mole per hour and HCl was additionally introduced in accordance with the present invention. HCl was preheated up to about 300° C. at a flow rate of 2.1 mole per hour, without being mixed with a diluting gas. The deposition reaction was executed while both TCS at a flow rate of 14.0 mole per hour and HCl were continuously supplied via the nozzle. The electric power of the heater was lowered to and fixed at 3.30 KW when both TCS and HCl began to be supplied. As a result of conducting the deposition reaction while keeping the above-mentioned conditions constant as shown in Table 2, the temperature at the topside of the fluidized bed was observed in the range of 829 to 880° C., due to an exothermic effect of HCl additionally introduced with the HCl/TCS ratio being 15% by mole, regardless not only of the lower electrical power of the heater but of the 40% increased flow rate of TCS introduced during the deposition reaction compared to that of Example 10 (Comparative Example). After 5 hours of deposition reaction, the weight of the deposited silicon was about 182 g, which showed about a 23% increase by the additional introduction of the reaction gas regardless of the lower electric power as compared to Example 10 (Comparative Example).

Example 15

As summarized in Table 2, the same deposition reaction of silicon as in Example 10 (Comparative Example) was repeated, except that the flow rate of TCS introduced was increased to be 14.0 mole per hour and HCl was additionally introduced in accordance with the present invention. HCl and hydrogen as an inert gas for diluting were mixed with each other with the flow rate of 2.1 mole and 1.0 mole per hour on average, respectively, and preheated to about 300° C. Then the deposition reaction was executed while additionally introducing the HCl/hydrogen mixture at every 5 minutes in a pulse type via gas distribution plate. The electric power of the heater was increased to and fixed at 3.76 KW when both TCS and HCl began to be supplied. While keeping the above-mentioned conditions constant, the deposition reaction was carried out. As shown in Table 2, the temperature at the topside of the fluidized bed was observed in the range of 841 to 905° C. due to an exothermic effect of HCl additionally introduced with the HCl/TCS ratio being 15% by mole, regardless not only of the lower electrical power of the heater but of the 40% increased flow rate of TCS introduced during the deposition reaction time compared to that of Example 10 (Comparative Example). After 5 hours of the deposition reaction, the weight of the deposited silicon was about 190 g, which showed about a 29% increase by the additional introduction of the reaction gas regardless of the lower electric power as compared to Example 10 (Comparative Example).

Example 16

As summarized in Table 2, the same deposition reaction of silicon as in Example 10 (Comparative Example) was repeated, except that the flow rate of TCS introduced was increased to be 16.0 mole per hour and HCl was additionally introduced in accordance with the present invention. HCl was preheated up to about 300° C. at a flow rate of 2.1 mole per hour, without being mixed with a diluting gas. The deposition reaction was executed while both TCS at a flow rate of 14.0 mole per hour and a half of the HCl preheated were continuously supplied via the nozzle. The other half of the HCl was supplied via the gas distribution plate. The electric power of the heater was increased to and fixed at 3.76 KW when both TCS and HCl began to be supplied. While keeping the above-mentioned conditions constant, the deposition reaction was carried out. As shown in Table 2, the temperature at the topside of the fluidized bed was observed in the range of 879 to 951° C. due to an exothermic effect of HCl additionally introduced with the HCl/TCS ratio being 20% by mole, regardless not only of the lower electrical power of the heater but of the 60% increased flow rate of TCS was introduced compared to that of Example 10 (Comparative Example) during the deposition reaction time. After 5 hours of the deposition reaction, the weight of the deposited silicon was about 201 g, which showed about a 36% increase by the additional introduction of the reaction gas, regardless of the lower electric power as compared to Example 10 (Comparative Example).

TABLE 1

| Item | | Ex. 1 (Com. Ex.) | Ex. 2 | Ex. 3 | Ex. 4 | Ex. 5 |
|---|---|---|---|---|---|---|
| (1) | Reaction gas | | | | | |
| (1-1) | Hydrogen Flow rate (mole/hr) | 7.2 | 7.2 | 7.2 | 7.2 | 7.2 |
| | Preheat temp. (° C.) | 100 | 100 | 100 | 100 | 100 |
| (1-2) | TCS Flow rate (mole/hr) | 4.8 | 4.8 | 4.8 | 4.8 | 4.8 |
| | Preheat temp. (° C.) | 100 | 100 | 100 | 100 | 100 |
| (2) | HCl Flow rate (mole/hr) | — | 0.05 | 0.24 | 0.48 | 0.96 |
| | Preheat temp. (° C.) | — | 200 | 200 | 200 | 200 |
| | Introducing method | — | Con. | Con. | Con. | Con. |
| (3) | HCl/TCS ratio (% by mole) | 0.0 | 1 | 5 | 10 | 20 |
| (4) | Total dep. reaction time | 4 | 4 | 4 | 4 | 4 |
| (5) | Si rod Sur.temp. (° C.) Deposition reaction start (t = 0) | 1,250 | 1,250 | 1,250 | 1,250 | 1,250 |
| | t = after 1 hr | 934 | 940 | 961 | 993 | 1,007 |
| | t = after 2 hr | 861 | 868 | 889 | 916 | 935 |
| | t = after 3 hr | 816 | 822 | 838 | 864 | 896 |
| | t = after 4 hr (stop) | 780 | 790 | 807 | 827 | 869 |
| (6) | Total amount of deposited Si (g) | 25.1 | 26.1 | 28.5 | 30.1 | 30.9 |

TABLE 1a

| Item | | Ex. 6 | Ex. 7 | Ex. 8 | Ex. 9 |
|---|---|---|---|---|---|
| (1) | Reaction gas | | | | |
| (1-1) | Hydrogen Flow rate (mole/hr) | 9.0 | 9.0 | 10.0 | 10.0 |
| | Preheat temp. (° C.) | 100 | 400 | 400 | 400 |
| (1-2) | TCS Flow rate (mole/hr) | 6.0 | 8.0 | 10.0 | 15.0 |
| | Preheat temp. (° C.) | 100 | 200 | 200 | 200 |
| (2) | HCl Flow rate (mole/hr) | 1.2 | 2.4 | 4.0 | 9.0 |
| | Preheat temp. (° C.) | 200 | 350 | 350 | 350 |
| | Introducing method | Con. | P | Con. | Con. |
| (3) | HCl/TCS ratio (% by mole) | 20 | 30 | 40 | 60 |
| (4) | Total dep. reaction time | 4 | 4 | 4 | 4 |
| (5) | Si rod Sur.temp. (° C.) Deposition reaction start (t = 0) | 1,250 | 1,250 | 1,250 | 1,250 |
| | t = after 1 hr | 995 | 1,082 | 1,071 | 1,105 |
| | t = after 2 hr | 911 | 1,023 | 1,012 | 1,085 |
| | t = after 3 hr | 870 | 993 | 998 | 1,092 |
| | t = after 4 hr (stop) | 844 | 971 | 991 | 1,081 |
| (6) | Total amount of deposited Si (g) | 35.8 | 40.0 | 41.9 | 38.7 |

TABLE 2

| Item | | Ex. 10 (Com.Ex.) | Ex. 11 | Ex. 12 | Ex. 13 |
|---|---|---|---|---|---|
| (1) | Reaction gas flow rate Hydrogen-distribution plate (mole/hr) | 13.2 | 13.2 | 13.2 | 13.2 |
| | Hydrogen-nozzle (mole/hr) | 1.8 | 1.8 | 1.8 | 1.8 |
| | TCS (mole/hr) | 10.0 | 10.0 | 10.0 | 10.0 |
| (2) | HCl Flow rate (mole/hr) | — | 0.2 | 1.0 | 1.0 |
| | Introduction | — | D.P | D.P | D.P |

TABLE 2-continued

| Item | Ex. 10 (Com.Ex.) | Ex. 11 | Ex. 12 | Ex. 13 |
|---|---|---|---|---|
| position | | | | |
| Introduction method | — | Con. | Con. | Con. |
| (3) HCl diluting gas | — | He | He | He |
| Flow rate (mole/hr) | — | 0.2 | 1.0 | 1.0 |
| (4) HCl/TCS ratio (% by mole) | 0 | 2 | 10 | 10 |
| (5) Total deposition reaction time (hr) | 5 | 5 | 5 | 5 |
| (6) Electric power for heater | | | | |
| Before dep.reaction (KW) | 3.40 | 3.40 | 3.40 | 3.40 |
| During dep.reaction (KW) | 3.76 | 3.76 | 3.76 | 3.00 |
| (7) Top temp. of fluidized bed | | | | |
| Before dep.re (° C.) | 1,020 | 1,020 | 1,020 | 1,020 |
| During dep.re (° C.) | 835–873 | 846–895 | 872–920 | 838–907 |
| (8) Total amount of deposited Si (g) | 148 | 157 | 170 | 159 |

TABLE 2a

| Item | Ex. 14 | Ex. 15 | Ex. 16 |
|---|---|---|---|
| (1) Reaction gas flow rate | | | |
| Hydrogen-distribution plate (mole/hr) | 13.25 | 13.2 | 13.2 |
| Hydrogen-nozzle (mole/hr) | 1.8 | 1.8 | 1.8 |
| TCS (mole/hr) | 14.0 | 14.0 | 16.0 |
| (2) HCl | | | |
| Flow rate (mole/hr) | 2.1 | 2.1 | 3.2 |
| Introduction position | nozzle | D.P | D.P/nozzle |
| Introduction method | Con. | P | Con. |
| (3) HCl diluting gas | — | hydrogen | — |
| Flow rate (mole/hr) | — | 1.0 | — |
| (4) HCl/TCS ratio (% by mole) | 15 | 15 | 15 |
| (5) Total deposition reaction time (hr) | 5 | 5 | 5 |
| (6) Electric power for heater | | | |
| Before dep.reaction (KW) | 3.40 | 3.40 | 3.40 |
| During dep.reaction (KW) | 3.30 | 3.76 | 3.76 |
| (7) Top temp.of fluidized bed | | | |
| Before dep.re (° C.) | 1,020 | 1,020 | 1,020 |
| During dep.re (° C.) | 829–880 | 841–905 | 879–951 |
| (8) Total amount of deposited Si (g) | 182 | 190 | 201 |

Note:
temp.: temperature
TCS: TCS
HCl: HCl
Con.: continuous method
P: pulse type every 5 minutes
dep.: deposition
Sur.temp.: surface temperature
Dep.re: deposition reaction
D.P: distribution plate Industrial Applicability As seen from the foregoing, in the preparation of polysilicon through the deposition reaction of reaction gas including silane gas, the present invention is much more efficient and convenient compared to all prior methods. The main effects of the present invention are as follows.

First, the present invention is a chemical heating method wherein an exothermic reaction is caused by introducing HCl in addition to the reaction gas into the reactor where the silicon deposition occurs, and the heat of reaction generated therein can be utilized in the deposition reaction of silicon. It thus provides a way to overcome the limits of the prior heating methods applied to the reactor. Accordingly, it reduces the load of heating imposed on the high-temperature deposition reaction and mitigates the technical problems and risks accompanying excessive heating. In addition, it allows a more increased flow rate of reaction gas into the reactor without any serious difficulty in heating, leading to an enhanced deposition of silicon.

Secondly, the chemical heating method according to the present invention solves the problem of cooling the surface temperature of silicon due to the heating of reaction gas, which is introduced into the reactor in low temperature via limited preheating, as well as to the heat of reaction consumed by the deposition reaction. Accordingly, the reaction temperature required for the deposition can be maintained with the limited external energy supply, resulting in an increase of process efficiency for silicon deposition. Furthermore, the present invention has advantages in that the exothermic effect, according to the gasification reaction between HCl and silicon, can be more noticeable as the surface temperature of silicon becomes lower. Therefore, immediately upon a sudden drop in temperature at silicon surface, the surface temperature can be raised again by the chemical heating effect according to the present invention.

Thirdly, it is notable that the HCl used in the chemical heating method of the present invention is one component of intermediates or byproducts of the silicon deposition process, and consists of the hydrogen and chlorine elements included in Si—H—Cl type silane gas. Thus, there are advantages in that, although additional HCl gas is introduced to the deposition reactor according to the present invention, there is no additional source of contamination because HCl is not a foreign component and any undesired new byproduct is not formed in the reactor by it. In addition, HCl can be used as a raw material for the preparation of chlorosilanes and can be prepared in the course of the recovery and separation process of the exhaust gas out of the deposition reactor. And it is easy to purify HCl. Thus, the present invention is economically preferred since high-purity and inexpensive HCl can be prepared in the preparation plant of polysilicon.

Fourthly, the chemical heating method of the present invention is based on the supply of HCl to the reactor in addition to the reaction gas and thus can be applied easily to the prior processes. Therefore, the already installed and existing reactors can be used "as it is", simply by adding or modifying a part of the reaction gas feeding section regardless of the reactor type, namely the bell-jar or a fluidized bed type. Furthermore, the present invention has merit in that its application does not require basically the modification of the internal structure or material of the already installed reactor. The present invention also provides a means for avoiding various problems and limiting factors accompanying the heating of a reactor, even in case of fabricating and using a new and different type of reactor. If it is economically advantageous to control the flow rate of HCl by optimizing the whole process for the preparation of polysilicon, so that the deposition reaction of silicon can become an exothermic reaction, the present invention can further limit the additional supply of energy from the outside of the reactor in the course of the deposition reaction. Accordingly, the present invention provides an advantage in that the supply of energy into the reactor, via heating means installed in the reactor, can be reduced or limited while the deposition reaction is carried out. This extends an allowable range for optimizing the design and operation of the reactor and the whole process for the preparation of polysilicon.

Fifthly, since the heat is generated on the surface of the silicon inside the reactor when the chemical heating method of the present invention is used for the fluidized bed reactor, the wall temperature can be maintained relatively lower than the case of the prior heating method based on heat supply through the reactor walls. This effect leads to reduction both in the problem of heavy silicon deposition on the inner wall surface of the reactor and in heat loss to the outside of the reactor.

What is claimed is:

1. A method for the preparation of polysilicon in the form of rod by depositing silicon on the surfaces of a core rod in a reactor, which comprises:

introducing into the reactor a reaction gas including a halogen-containing silane gas;

introducing hydrogen chloride into the reactor in addition to the reaction gas, wherein a ratio of hydrogen chloride to said silane is less than an equimolar ratio;

utilizing within the reactor heat of reaction generated from an exothermic reaction of the hydrogen chloride; and maintaining the surfaces of the core rod at a temperature in the range of approximately 600 to 1,200° C.

2. A method for the preparation of polysilicon according to claim 1, wherein the exothermic reaction is a gasification reaction between the hydrogen chloride and silicon.

3. A method for the preparation of polysilicon according to claim 1, wherein the pressure within the reactor is approximately 1 to 10 bar.

4. A method for the preparation of polysilicon according to claim 1, wherein the halogen-containing silane gas is selected from the group consisting of trichlorosilane and dichlorosilane.

5. A method for the preparation of polysilicon according to claim 1, wherein the hydrogen chloride is supplied into the reactor in combination with the halogen-containing silane gas via a supply element of the halogen-containing silane gas.

6. A method for the preparation of polysilicon according to claim 1, wherein the halogen-containing silane gas and the hydrogen chloride are separately supplied into the reactor via separate supply element.

7. A method for the preparation of polysilicon according to claim 1, wherein the hydrogen chloride is supplied into the reactor in combination with an inert gas which does not react with the hydrogen chloride within a supply element.

8. A method for the preparation of polysilicon in the form of granules by depositing silicon on the surfaces of silicon particles in a reactor, which comprises:

introducing into the reactor a reaction gas including a halogen-containing silane gas;

introducing hydrogen chloride into the reactor in addition to the reaction gas, wherein a ratio of hydrogen chloride to said silane is less than an equimolar ratio;

utilizing within the reactor heat of reaction generated from an exothermic reaction of the hydrogen chloride; and maintaining the silicon particles at a temperature in the range of approximately 600 to 1,200° C.

9. A method for the preparation of polysilicon according to claim 1, wherein the reactor is a bell-jar reactor.

10. A method for the preparation of polysilicon according to claim 8, wherein the reactor is a fluidized-bed reactor.

11. The method for the preparation of polysilicon according to claim 8, wherein the exothermic reaction is a gasification reaction between the hydrogen chloride and silicon.

12. The method for the preparation of polysilicon according to claim 8, wherein the pressure within the reactor is within a range of between about 1 bar and about 10 bar.

13. The method for the preparation of polysilicon according to claim 8, wherein the halogen-containing silane gas is selected from the group consisting of trichlorosilane and dichlorosilane.

14. The method for the preparation of polysilicon according to claim 8, wherein the hydrogen chloride is supplied into the reactor in combination with the halogen-containing silane gas via a supply element of the halogen-containing silane gas.

15. The method for the preparation of polysilicon according to claim 8, wherein the halogen-containing silane gas and the hydrogen chloride are separately supplied into the reactor via separate supply element.

16. The method for the preparation of polysilicon according to claim 8, wherein the hydrogen chloride is supplied into the reactor in combination with an inert gas which does not react with the hydrogen chloride within a supply element.

* * * * *